(12) United States Patent
Anderson et al.

(10) Patent No.: US 7,790,611 B2
(45) Date of Patent: Sep. 7, 2010

(54) METHOD FOR FEOL AND BEOL WIRING

(75) Inventors: Brent A. Anderson, Jericho, VT (US); John J. Ellis-Monaghan, Grand Isle, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 476 days.

(21) Appl. No.: 11/749,898

(22) Filed: May 17, 2007

(65) Prior Publication Data

US 2008/0284021 A1 Nov. 20, 2008

(51) Int. Cl.
*H01L 21/44* (2006.01)

(52) U.S. Cl. .................. 438/653; 438/652; 438/655; 438/657; 257/751; 257/E21.476; 257/E23.01

(58) Field of Classification Search ............... 257/751, 257/E21.476, E23.01; 438/652, 653, 655, 438/657
See application file for complete search history.

(56) References Cited

U.S. PATENT DOCUMENTS

| 5,349,229 | A | 9/1994 | Wei et al. |
| 5,427,981 | A | 6/1995 | Choi |
| 6,569,767 | B1 | 5/2003 | Fujisawa et al. |
| 6,989,323 | B2 | 1/2006 | Doris et al. |
| 7,531,421 | B2 * | 5/2009 | Sandhu ................. 438/396 |
| 2002/0055253 | A1 * | 5/2002 | Rudhard ................. 438/672 |
| 2002/0098683 | A1 | 7/2002 | Yasumoto |
| 2005/0106859 | A1 | 5/2005 | Kim et al. |
| 2005/0245008 | A1 * | 11/2005 | Doris et al. ............... 438/151 |
| 2006/0051959 | A1 * | 3/2006 | Iwatake et al. ............ 438/643 |

* cited by examiner

*Primary Examiner*—Bradley K Smith
*Assistant Examiner*—Marvin Payen
(74) *Attorney, Agent, or Firm*—Scully, Scott, Murphy & Presser, P.C.; Richard M. Kotulak, Esq.

(57) ABSTRACT

A method for forming a conductive structure of sub-lithographic dimension suitable for FEOL and BEOL semiconductor fabrication applications. The method includes forming a topographic feature of silicon-containing material on a substrate; forming a dielectric cap on the topographic feature; applying a mask structure to expose a pattern on a sidewall of the topographic feature, the exposed pattern corresponding to a conductive structure to be formed; depositing a metal at the exposed portions of the sidewall and forming one or more metal silicide conductive structures at the exposed sidewall portions; removing the dielectric cap layer; and removing the silicon-containing topographic feature. The result is the formation of one or more metal silicide conductor structures formed for a single lithographically defined feature. In example embodiments, the formed metal silicide conductive structures have a high aspect ratio, e.g., ranging from 1:1 to 20:1 (height to width dimension).

17 Claims, 3 Drawing Sheets

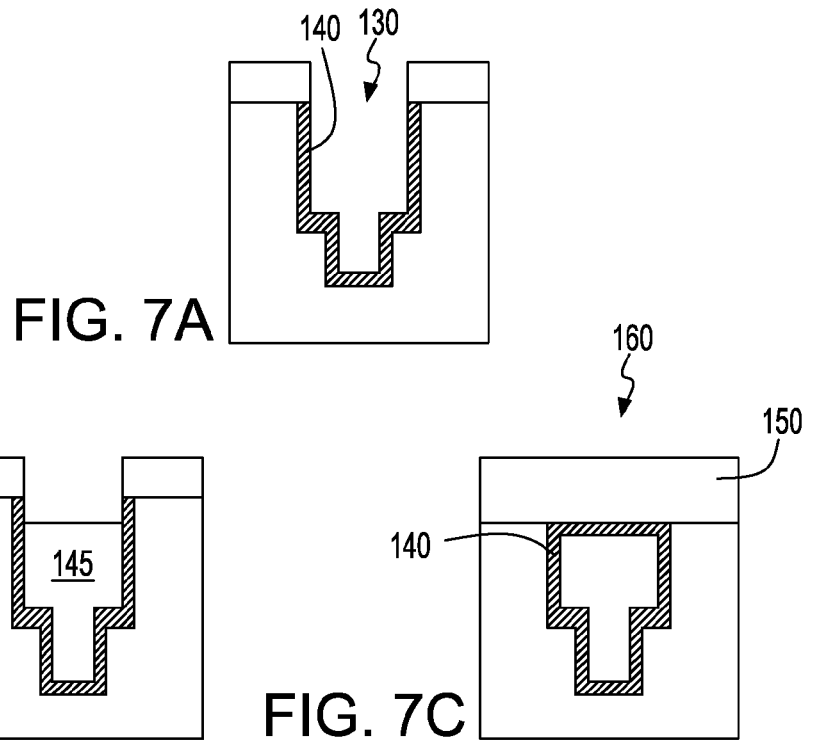
FIG. 7A
FIG. 7B
FIG. 7C
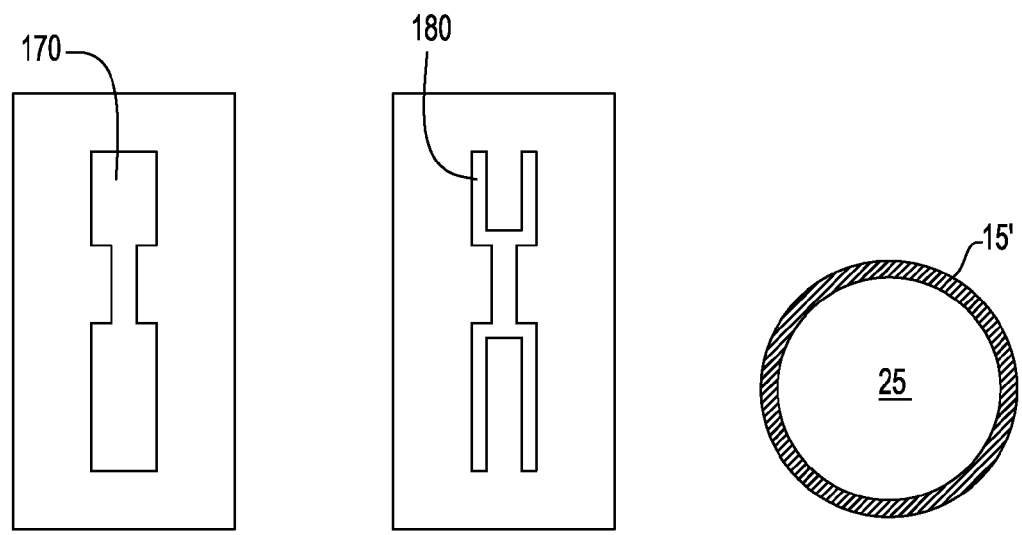
FIG. 8A
FIG. 8B
FIG. 9

METHOD FOR FEOL AND BEOL WIRING

FIELD OF THE INVENTION

The present invention relates to semiconductor devices and structures generally, and particularly, to a novel conductive structure that can be used for Front End of Line (FEOL) and Back End of Line (BEOL) applications.

Description of the Prior Art

Techniques for forming small conductive structures in semiconductor devices abound in the patent literature, e.g., U.S. Pat. Nos. 5,349,229 and 6,989,323 and U.S. Patent Publication No. 2002/0098683 A1 being representative. For example, U.S. Pat. No. 5,349,229 is directed to formation of a local interconnect, defined in a polycrystalline silicon layer. Openings to underlying conducting regions are made through an insulating layer after the local interconnect conductor definition. A thin extra polycrystalline silicon layer is then deposited over the device and etched back to form polycrystalline silicon sidewall elements. These sidewalls connect the polycrystalline silicon local interconnect conductors to the underlying conductive regions. Standard silicidation techniques are then used to form a refractory metal silicide on the exposed underlying conductive regions, the polycrystalline silicon sidewall elements, and the polycrystalline silicon local interconnect conductors. This results in a complete silicided connection between features connected by the local interconnect conductors.

U.S. Pat. No. 6,989,323 describes a gate structure for a semiconductor device formed by defining a conductive sacrificial structure on a substrate; forming a reacted metal film on sidewalls of the conductive sacrificial structure; and removing unreacted portions of the conductive sacrificial structure. The uniformity of the gate conductor is largely determined by the uniformity of the growth of the reacted metal film (e.g., cobalt silicide), which does not suffer from the large through-pitch variations that are typically observed with conventional optical lithographic methods.

U.S. Patent Publication No. 2002/0098683 A1 describes a wiring of silicon formed on a surface of a semiconductor substrate. Part of the wiring is covered with a resist pattern. Ion implantation is conducted on the substrate using the resist pattern as a mask and then the resist pattern is removed. An upper section of the wiring with a thickness of at least 5 nm is removed to minimize thickness of the wiring. Reaction is caused between a surface section of the wiring of which thickness is thus reduced and a metal which reacts with silicon to thereby form a metal silicide film on a surface of the wiring. Resistance of the wiring can be reduced with good reproducibility.

Particular techniques described in the patent literature that require first a patterning polysilicon, depositing and patterning dielectric film, depositing metal and react metal to form silicide; and removing the unreated metal and polysilicon to leave the conducting metal-silicide structure are described to some extent in U.S. Pat. Nos. 5,427,981 and 6,569,767 and U.S. Patent Publication No. 2005/0106859 A1.

U.S. Pat. No. 5,427,981, for example, teaches a process for fabricating a metal plug having a uniform surface capable of preventing a junction consumption reaction. The process includes preparing a semiconductor substrate which includes a first wiring layer, an insulating film formed over the first wiring layer and a contact hole formed in the insulating film such that the surface of the insulating film is exposed through the contact hole, forming a polysilicon film to a predetermined thickness over the entire exposed surface of the resulting structure after the formation of the contact hole, forming a photoresist pattern at a bottom portion of the contact hole on which the polysilicon film is disposed, removing an exposed portion of the polysilicon film not hidden by the photoresist pattern and then removing the photoresist pattern, forming a first metal film over the entire exposed surface of the resulting structure after the removal of the photoresist pattern, reacting the first metal film with the polysilicon film by a thermal treatment, thereby forming a metallic silicide film at the bottom portion of the contact hole, removing the remaining first metal film not reacted with the polysilicon film and filling the contact hole with a second metal material for forming a metal plug buried in the contact hole formed with the metallic silicide film.

U.S. Pat. No. 6,569,767 for example, teaches a process for producing a semiconductor device comprising the steps of: forming a metal wiring layer containing copper as the main component on a semiconductor substrate; forming an insulating film on the entire surface of the resulting semiconductor substrate; removing the insulating film only from a place where a wire of gold or aluminum is to be bonded, in order to expose a part of the metal wiring layer; forming a layer of copper silicide or a layer of a compound of copper and boron in a surface layer of the exposed part of the metal wiring layer; and bonding a wire to a surface of the layer of copper silicide or the layer of the compound of copper and boron.

U.S. Patent Publication No. 2005/0106859 A1 teaches a method of forming a silicide film which can include forming a first metal film on a silicon substrate and forming a second metal film on the first metal film at a temperature sufficient to react a first portion of the first metal film in contact with the silicon substrate to form a metal-silicide film. The second metal film and a second portion of the first metal film can be removed so that a thin metal-silicide film remains on the silicon substrate.

Currently, each of these techniques for forming small conductive structures such as local interconnects, plugs, strappings, wires, and other conducting structures in semiconductor devices are increasing in cost and complexity at a faster rate than most other processes. This is primarily due to the reason that features sizes continue to shrink while lithography does not advance at the same rate. Additionally, as features scale, resistance of the conductive structures is becoming a greater detractor to performance.

It would thus be highly desirable to provide a conductive structure comprising one or more wire structures, and, in one embodiment, two parallel wires that can be created for single lithography defined features.

It would further be highly desirable to provide a technique for forming one or more conductive structures, e.g., wires, on silicon containing structures, that exhibit good resistance characteristics and can be formed during FEOL and BEOL applications.

SUMMARY OF THE INVENTION

The present invention is directed to semiconductor conductive structures and a method for forming the conductive structures.

The present invention is directed to semiconductor conductive structures and a method for forming the conductive structures that is applicable for both FEOL and BEOL semiconductor fabrication applications. The conductive structures comprise one or more wire structures that are small and spaced close together.

The semiconductor conductive structures applicable for both FEOL and BEOL semiconductor fabrication applications comprise one or more wire structures that are small and spaced close together and, in an exemplary embodiment, comprises a metal silicide material of sub-lithographic feature size dimensions.

The semiconductor conductive structure that is applicable for both FEOL and BEOL semiconductor fabrication applications, and that comprises a silicide wire structure, is of a high aspect ratio.

The conductive structure itself comprises one or more conductive wire structures, and, in one embodiment, two or more parallel wires are created for single lithography defined features.

Thus, by using sidewall formed wiring, two or more thin wire structure can be created for a single lithography defined feature. In this example a polysilicon structure with a dielectric cap is silicided, the cap is removed, and the polysilicon is removed—resulting in at least two parallel silicide wires. These structures can be used in the FEOL for dense arrays, local interconnects, strapping, etc. they can also be used in the early wiring levels as standalone wires.

According to one aspect of the invention, there is provided a conductive structure and, a method for forming a conductive structure of sub-lithographic dimensions. The method includes forming a topographic feature of silicon-containing material on a substrate; forming a dielectric cap on the topographic feature; applying a mask structure to expose a pattern on a sidewall of the topographic feature, the exposed pattern corresponding to a conductive structure to be formed; depositing a metal at the exposed portions of the sidewall and forming one or more metal silicide conductive structures at the exposed sidewall portions; removing the dielectric cap layer; and removing the silicon-containing topographic feature. The result is the formation of one or more metal silicide conductor structures formed for a single lithographically defined feature.

In example embodiments, the formed metal silicide conductor structures can support a range of aspect ratio's (e.g., 1:1 to 20:1; 0.5:1 to 10:1).

Furthermore, conductive structures can be formed that are later filled with conductive material, e.g., to form a via, or, used to define a feature by selective plating of the conductive structures.

According to a further aspect of the invention, there is provided a vertically oriented conductive wire structure of sub lithographic dimension having a metal silicide material as a component, the wire structure exhibiting a high aspect ratio ranging from 1:1 to 20:1 (height to width dimension). The conductive wire structure of sub lithographic dimension includes a first vertical side being a silicide growth front and a second vertical side being a silicide non-growth front.

In one embodiment, the conductive wire structure of sub lithographic dimension may further comprise an outer material component and inner material component, wherein the inner material component is a silicide and the outside material is plated with a conductive material.

In a further aspect of the invention, there is provided a structure comprising a pair of vertically oriented conductive wires of sub lithographic dimension having a metal silicide material as a component, the wire structures exhibiting a high aspect ratio ranging from 0.5:1 to 10:1 (height to width dimension). The conductive wire structure of sub lithographic dimension includes a first vertical side being a silicide growth front and a second vertical side being a silicide non-growth front. In one embodiment, the vertical silicide growth fronts of both wires are facing each other and vertical silicide non-growth fronts are facing to the outside of the structure.

Moreover, the conductive wire structure of sub lithographic dimension comprises an outer material component and inner material component, wherein the outside material component is the silicide material and the inner material component is a conductive material.

In all embodiments, there is provided a method of forming a conductor structure for use in FEOL and BEOL semiconductor processing applications comprising:

providing a first structure of material;

forming a topographic feature of silicon-containing material on top the first structure and, a dielectric cap layer on top the topographic feature;

applying a mask to expose a sidewall portion of the topographic feature corresponding to a conductive structure to be formed;

depositing a metal at the exposed sidewall portion;

forming a metal silicide structure that encircles the topographic feature;

removing the topographic feature and the dielectric cap layer to form a trench;

forming a metal diffusion barrier liner layer conforming to bottom and sidewall surface; and depositing a metal conductor material in the trench.

Advantageously, the method for forming the conductive structures as described can be used to form structures of complex shapes using standard semiconductor and lithographic processing techniques.

BRIEF DESCRIPTION OF THE DRAWINGS

The objects, features and advantages of the present invention will become apparent to one skilled in the art, in view of the following detailed description taken in combination with the attached drawings, in which:

FIGS. 7A-7C, through cross-sectional views, depict similar processing steps as described with respect to FIGS. 2A and 2B, to result in a structure 160;

FIGS. 8A and 8B, through top plan views, show the complex wire shapes 170, 180 respectively, formed according to the techniques of the present invention;

FIG. 9 depicts a top plan-view of the formed silicided sidewall portion 15' encircling the polysilicon topographic feature 25 according to exemplary embodiments of the present invention.

DETAILED DESCRIPTION OF PREFERRED EMBODIMENTS

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

The present invention provides a method for forming small silicide wires spaced close together at or coupled to device regions contained by a semiconductor substrate. The resulting structure contains metal silicide structures characterized as having a substantially high aspect ratio.

Figure 1:
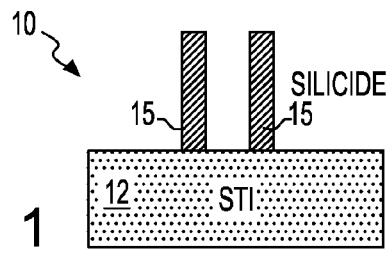
FIG. 1 illustrates, through a cross-sectional view, a wiring structure 10 according to a first embodiment of the invention formed during either FEOL and BEOL processes.

FIG. 1 illustrates, through a cross-sectional view, a wiring structure 10 according to a first embodiment of the invention formed as a result of either FEOL and BEOL processes. In FIG. 1, the example wire structure 10 includes one or more vertically oriented high aspect ratio silicide structures 15, formed atop a Shallow Trench Isolation (STI) structure 12 as shown in FIG. 1. The silicide structures 15 may additionally be formed atop a semiconductor (e.g., Silicon-containing) substrate 10. Preferably, the height to width ratio of the silicide structure 15 is in the range from 1:1 to 20:1, but this is configurable. In one example embodiment, a silicide wire structure is about 150 nm in height and about 30 nm wide.

Figure 2A:
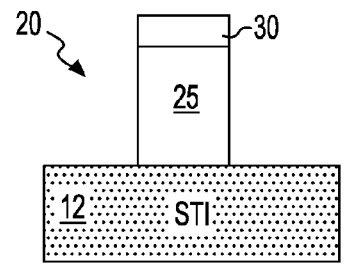
FIGS. 2A-2B illustrate, through cross-sectional views, exemplary processing steps according to a first embodiment of the invention.

The exemplary processing steps of the present invention will now be described in greater detail by referring to the accompanying FIGS. 2A-2B. In FIG. 2A, there is shown a topographic feature, e.g., a silicon containing structure 25, having a dielectric cap material 30 formed on top of the STI structure 12 previously formed utilizing a conventional trench isolation process well known to those skilled in the art. For example, lithography, etching and filling of the trench with a trench dielectric material may be used in forming the trench isolation structure 12. The STI may comprise an oxide, nitride, or oxynitride of silicon. Optionally, a liner may be formed in the trench prior to trench fill, a densification step may be performed after the trench fill and a planarization process may follow the trench fill as well. In still alternate embodiments, the silicon containing structure 25 may be formed atop a silicon-containing substrate with or without a thin dielectric liner deposited on the surface thereof underneath the silicon containing structure 25.

In one exemplary embodiment, the silicon containing topographic feature 25 is polysilicon or polysilicongermanium (polySi or polySiGe) and formed as an upstanding vertical structure formed in accordance with conventional techniques now described. The polySi structure 25 shown in FIG. 2A may be formed as a layer utilizing a known deposition process such as: CVD, plasma-assisted CVD, sputtering, plating, evaporation and other like deposition processes (e.g., a low pressure CVD). A thin protective dielectric material cap layer 30 is then deposited on top of the thin poly layer surface. Preferably, the dielectric material comprises an oxide, e.g., $SiO_2$, a nitride, or oxynitride material or any combination thereof In one embodiment, a nitride such as, for example, $Si_3N_4$, is employed as the dielectric cap layer. The polysilicon structure layer and top dielectric cap layer may then be patterned and etched at the same time by conventional photolithographic techniques to form the structure 20 including silicon containing structure 25 having a top dielectric cap 30 shown in FIG. 2A. It is understood that the layer of polysilicon may be doped or undoped. If doped, an in-situ doping deposition process may be employed in forming the same. Alternatively, a doped polySi layer can be formed by deposition, ion implantation and annealing.

The sidewall regions of the polysilicon structure 25 of FIG. 2A are patterned by lithographically forming a mask and etching to expose a pattern on the sides of the polysilicon structure where the silicidation is desired to form the wire structures. The lithography step includes applying a layer of photoresist material to the polysilicon and formed cap, exposing the photoresist to a desired pattern of radiation and developing the exposed photoresist utilizing a conventional resist developer. The pattern in the photoresist is then transferred to the polysilicon structure sidewalls utilizing one or more dry etching steps. Suitable dry etching processes that can be used in the present invention in forming the patterned sidewalls include, but are not limited to: reactive ion etching, ion beam etching, plasma etching or laser ablation. The dry etching process employed should not remove the dielectric cap layer 30 atop the polySi structure 25. Alternatively, a second dielectric layer may be formed and lithographically patterned over the polysilicon feature sidewalls whereby portions of the dielectric layer may be removed to expose the polysilicon sidewalls where a metal may be deposited to react and form the silicide. This second dielectric film enables control over where a formed wire will stop and start.

Thus, as a result of etching away the second dielectric covering the polySi structure sidewalls, a pattern of exposed polySi structure sidewall portions is provided that correspond to the desired silicide wire structure 15 to be formed. In one embodiment, one or more exposed sidewall portions are formed on opposite sidewalls of the topographic feature 25 that will result in two upstanding parallel metal silicide wire structures of sub-lithographic feature dimensions. As shown in FIG. 1, the high aspect ratio metal silicide wire structures are formed on opposite sidewalls of the topographic feature. It is understood, however, that many vertically oriented parallel silicide wire structures may be formed according to the process described herein. Moreover, as is understood by a person skilled in the art, the formed silicided sidewall portion 15' may encircle the polysilicon topographic feature 25 when viewed in plan-view as shown in FIG. 9. Thus, the entire polySi structure sidewall may be exposed which results in a thin hollowed silicide conductive structure that may be further filled with conductor material, as will be described in greater detail hereinbelow.

The next step involves forming the silicide wire structures 15 in the exposed polySi structure sidewalls by blanket depositing a metal on the exposed polySi sidewall surfaces, and then performing one or more annealing steps to form a silicide, and then, selectively etching any non-reacted metal and the capping layer. More particularly, the pattern of exposed polySi structure sidewall portions becomes reacted with the silicide metal, i.e., any metal that is capable of reacting with silicon to form a metal silicide. Examples of such metals include, but are not limited to: Ti, Ta, Al, W, Co, Mo, Ni, Pt, Pd or alloys thereof. The metal material used to form the silicide may be deposited using any conventional deposition process including, for example, sputtering, chemical vapor deposition, a physical vapor deposition (PVD) of the silicide evaporation, chemical solution deposition, plating and the like. It should be understood that if the silicide wires are to be formed on a silicon containing substrate and not STI, a thin dielectric layer may be formed on the top surface either prior to or after forming the polysilicon structure 25 so that the silicide is not formed at the underlying silicon substrate. In some embodiment, however, it may be advantageous to remove a portion of any thin dielectric layer in order to form a silicided conductive structure on the substrate surface that may be attached to the formed wires 15.

After deposition of the silicide metal on the exposed polysilicon sidewall portions defining dimensions of the silicide wire structures 15, a thermal anneal process is employed to form a silicide phase in the structure; preferably, the silicide representing the lowest resistivity phase of a metal silicide. The anneal is performed utilizing the ambients and temperatures well known in the art that cause the silicide metal to react with the underlying polysilicon to form the metal silicide layer 15 as shown in FIG. 2B. It is understood that the depth of the blanket silicide metal deposition and anneal (temperature and timing) conditions are carefully controlled according to conventional techniques to ensure that the silicide wires 15 are formed of desired dimensions, i.e., aspect ratios achieved. In one embodiment, the silicide metal may comprise Co noting that $CoSi_2$ forms using a two step annealing process as known in the art. In another embodiment of the present invention, the silicide metal is Ni or Pt; NiSi and PtSi being formed using a single annealing step. Then, a selective wet etch step may be employed to remove any non-reactive silicide metal from the structure.

Figure 2C:
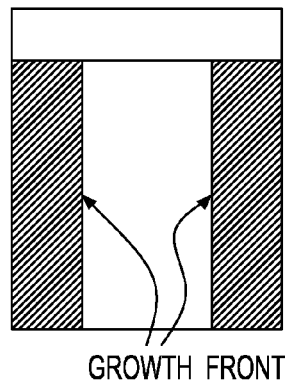
FIG. 2C illustrates the interface between the silicide and the silicon (e.g., polysilicon) where contacted which may be referred to herein as a silicide "growth front"; the outer vertical side may also be referred to as a silicide "non-growth front"
Figure 2B:
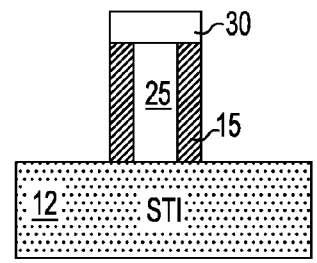

In one exemplary embodiment, the structure is annealed at approximately 600° C. to about 800° C. for approximately 30 seconds in a nitrogen environment to react with the portions of the polysilicon 25 to form the conductive silicide wire structures 15 along the sidewalls of the topographic polySi feature 25 as shown in FIG. 2B.

FIG. 2B particularly depicts the resulting intermediate structure showing one of two silicide wire structures 15 formed on the polySi structure 25 as a result of said salicidation process. Preferably, the silicide wire structures so formed to have an aspect ratio from 1:1 to 20:1 (height to width dimension), or, for example, 0.5:1 to 10:1 (height to width dimension). FIG. 2C illustrates the interface between the silicide and the silicon (e.g., polysilicon) where contacted (prior to the silicon being removed) that may be referred to as a silicide "growth front". The outer vertical side of the silicide wire structure may also be referred to as a silicide "non-growth front".

Then, a next step involves removing the dielectric cap 30 from the polySi structure 25. First, the dielectric cap is stripped from the structure using an etching process that is selective to the Si containing material, i.e., polySi. Although any chemical etchant may be used in removing the dielectric cap layer materials 30 in one embodiment dilute hydrofluoric acid (DHF) is used. Next, the underlying polySi structure 25 is removed to leave the remaining upstanding silicide wire structures 15 in tact as shown in FIG. 1. That is, an etching process is performed selective to the silicide and underlying STI to remove the polysilicon from the intermediate structure shown in FIG. 2B. In one embodiment, a chemical etching, e.g., potassium hydroxide (KOH) etch is performed stopping atop the STI layer oxide layer 18. Other techniques including an isotropic etching of the polySi structure using a chlorine-containing wet or dry etch, or alternatively, an anisotropic etch including a KOH or $NH_4OH$ based wet solution, may be implemented.

Thus, in the example depicted in FIGS. 2A-2B, a polySi line with a dielectric cap is silicided, the cap is removed, and the polySi is removed—resulting in two parallel silicide wires shown in FIG. 1. These structures can be used in the FEOL for dense array wiring, local interconnects, strapping, etc. These structures can also be used in the early wiring levels as standalone wires. These structures can be used in the BEOL as dense pitch metal lines or can be used to define a feature which is later filled or used to define a feature by selective plating. By using sidewall formed wiring, two wires of high aspect ratio can be created for a single lithography defined feature.

Thus, what is presented as shown in the example embodiments shown in FIGS. 2A and 2B is effectively an image doubling technique to fabricate high density conductors without complex/expensive lithography. These silicide conductors have lower resistance than polysilicon and the technique offers flexibility to create wires exactly where desired without major changes to existing semiconductor processing techniques.

Figure 3A:
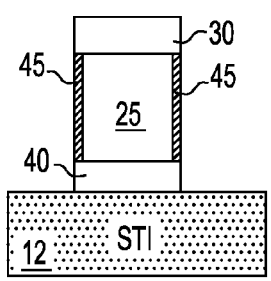
FIGS. 3A-3C, through cross-sectional views, depict similar processing steps as described herein with respect to FIGS. 2A and 2B, that result in a conductive structure 50 shown in FIG. 3C according to a second embodiment of the invention.
Figure 3B:
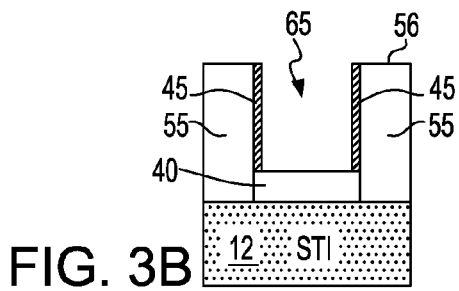
Figure 3C:
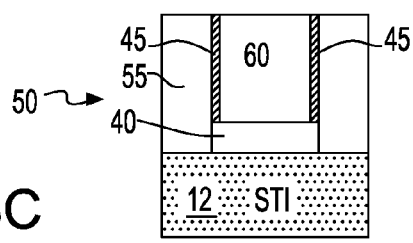

The methods of the present invention enables the fabrication of a variety of alternative silicide conductive structures. For instance as shown in FIGS. 3A-3C, through cross-sectional views, similar steps are performed as described with respect to FIGS. 2A and 2B, that result in a conductive structure 50 shown in FIG. 3C having thin silicide sidewall structures 45 filled with a conductor material 60. In the process of forming the structure of FIG. 3C, however, it is understood that a thin silicide structure, or, preferably any material that acts as a metal (e.g., Copper) diffusion barrier 40 is first formed on top the STI 12 or Si-containing substrate above which is formed the polySi structure 25. Example metal diffusion barrier materials include, but are not limited to Ti, Ta, TiTa, TiN, TaN, TiSiN, W. Then, the steps of forming the polysilicon material layer and top surface dielectric cap layer and etching the same to enable formation of a thin sidewall silicidation 45 of a resultant polysilicon structure 25 as shown in FIG. 3A is performed according to the process as described herein with respect to FIGS. 2A-2B. Although not shown in the cross-sectional view of FIG. 3A, the whole polysSi topographic feature sidewall is encircled with silicide. That is, the whole polySi sidewall structure 25 may be blanket deposited with a metal at a sufficient thickness that, when annealed, forms a thin silicide structure 45 around (encircling) the polySi structure 25, the silicide 45 being in electrical contact with the bottom diffusion barrier 40. After forming the thin silicidation 45, a protective dielectric material layer 55, e.g., oxide, nitride, or oxynitride, is blanket deposited to encapsulate the silicided sidewalls and inner polySi structure 25 such as shown in FIG. 3B, and a chemical-mechanical polish (CMP) step is thereafter formed to planarize the top surface 56 of the structure to the polySi level. With the top surface of the polySi structure 25 exposed, utilizing the chemical etching techniques described herein, an etch process may then be performed to remove the polySi structure leaving a trench 65 defined by the encircled silicided sidewall structure 45 and bottom diffusion barrier layer 40 that prevents diffusion of the copper material as shown in FIG. 3B. Then, the trench may be filled with a conductor material, e.g., Copper, to result in the conductive structure 50 encapsulated with the diffusion barrier 40, 45 or copper cladding as shown in FIG. 3C. Thus, for instance, the resulting conductive structure 50 may function as a conducting via formed in accordance with the invention, rather than formed according to the typical dual damascene techniques currently implemented in the art.

Figure 4A:
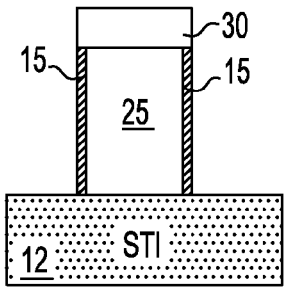
FIGS. 4A-4C, through cross-sectional views, depict similar processing steps as described herein with respect to FIGS. 2A and 2B, to result in silicided wiring structures 75 as shown in FIG. 4C according to a further embodiment of the invention.
Figure 4B:
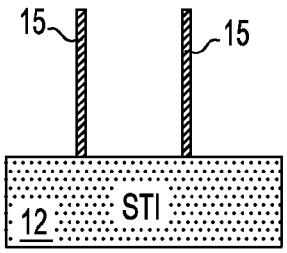
Figure 4C:
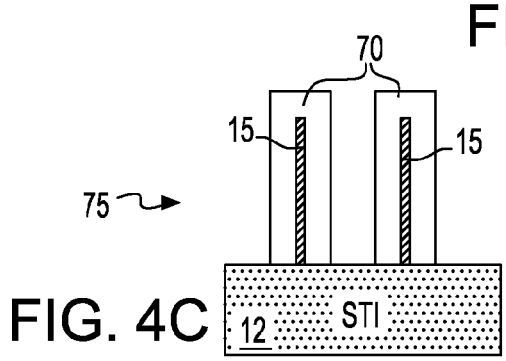

In an alternative embodiment shown in FIGS. 4A-4C, through cross-sectional views, similar steps are performed as described with respect to FIGS. 2A and 2B, to result in a silicided wiring structures 75 as shown in FIG. 4C. In the embodiment shown in FIG. 4A, the steps of forming the polysilicon topographic feature include forming a polysilicon layer and a top surface dielectric cap layer on top and etching the same to enable formation of a thin sidewall silicidation 15 of the resultant polysilicon line 25 as shown is performed according to the process as described herein with respect to FIGS. 2A-2B. In the embodiment depicted in FIG. 4A and 4B, two thin sidewall silicidations 15 are formed on opposite sidewall portions. Then, the dielectric cap layer 30 is removed and the polySi 25 is removed to result in the two upstanding silicide wire structures shown in FIG. 4B. Then, using techniques known in the art, these two upstanding silicide wire structures 15 shown in FIG. 4B are plated or coated with another material 70 to stiffen or enlarge the structures 15.

Figure 5:
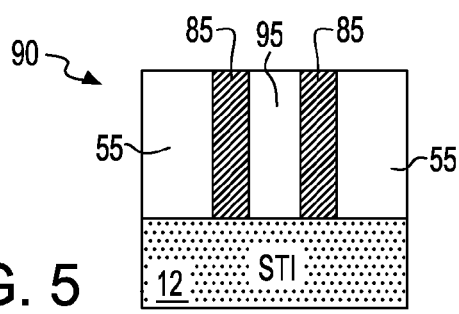
FIG. 5, through cross-sectional view, depicts a formed structure comprising two silicide wire structures formed in the manner described herein having either a low-k dielectric material formed therebetween for wiring applications or, a high-k dielectric material formed therebetween for use as a capacitor structure 90 according to a further embodiment of the invention.

In still a further alternative embodiment, as shown in FIG. 5, the two silicide wire structures as formed in the manner described herein after the polySi strip, may have a low-k dielectric material formed therebetween for wiring applications or, may have a high-k dielectric material formed therebetween for use as a capacitor structure 90. The methodology for forming such a structure 90, as shown in FIG. 5, is as follows: first, forming the thin sidewall silicidations 85 along the polySi structure sidewall in the manner as described herein with respect to FIGS. 2A-2C, and then depositing a dielectric material 55 that encircles (surrounds) the structure. Then, a CMP polishing step is performed to remove the dielectric cap previously formed on top of the polySi. Then, the polySi is removed from the selective polySi etch process described herein. Finally, a dielectric material 95, e.g., a low-k or high-k dielectric material, is deposited between the thin sidewall silicidations 85 which is wholly surrounded by the dielectric material 55.

Figure 6A:
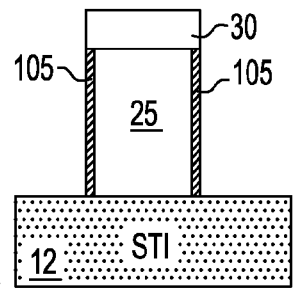
FIGS. 6A-6C, through cross-sectional views, depict similar processing steps as described with respect to FIGS. 2A and 2B, to result in a structure 100 that does not constitute image doubling by silicide or replacement according to a further embodiment of the invention.
Figure 6B:
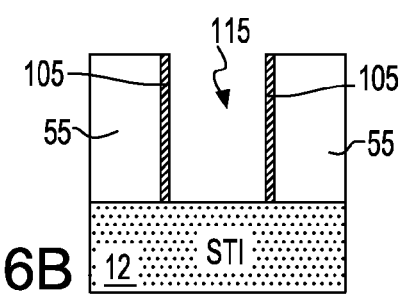
Figure 6C:
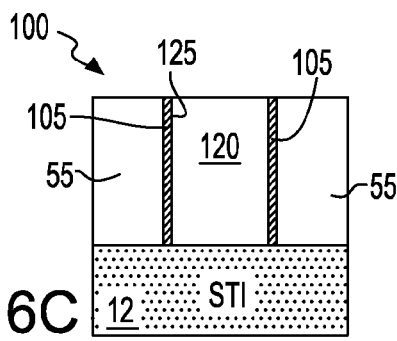

In an alternative embodiment shown in FIGS. 6A-6C, through cross-sectional views, similar steps are performed as described with respect to FIGS. 2A and 2B, to result in a structure 100 that does not constitute image doubling by silicide or replacement, i.e., it is a one-dimension structure used to create a structure of the original dimension. This process however implements steps similar to the methodology described hereinabove, namely: first, as shown in FIG. 6A, forming the thin sidewall silicidations 105 along the polySi structure sidewall in the manner as described herein with respect to FIGS. 2A-2C, and then depositing a dielectric material 55 that surrounds the structure. Then, a CMP polishing step is performed to remove the dielectric cap 30 previously formed on top of the polySi. Then, the polySi 25 is removed by the selective polySi etch process described herein as shown in FIG. 6B thus forming a trench structure 115. Then, a standard metal liner, e.g., of a refractory metal or alloy thereof such as Ti, Ta, TiTa, TiN, TaN, TiSiN, W is deposited to form a metal liner layer 125 that conforms along the inner surfaces including the bottom surface of the trench 115. The resultant lined trench structure is then filled with a conductor material to result in the structure 100 shown in FIG. 6C.

In a further alternative embodiment shown in FIGS. 7A-7C, through cross-sectional views, similar steps are performed as described with respect to FIGS. 2A and 2B, to result in a structure 160 that does not constitute image doubling by silicide or replacement, i.e., it is a one-dimension structure used to create a structure of the original dimension. The steps shown in FIG. 7A include the formation of a thin sidewall silicadation 140 of a damascene structure 130 formed out of the silicon-containing topographic feature, and in FIG. 7B, the deposition of a conductor material 145, e.g. a metal, and the subsequent CMP step and etch back step to recess the height of the metal material to below the surface to result in the structure shown in FIG. 7B.

Subsequently, using chemical deposition techniques as described herein, a dielectric cap layer is formed above the conductive material formed in the recess, e.g., and a polishing step is formed to flatten the resulting surface topography. Then, a dielectric fill step is performed wherein a further dielectric material 150 is formed around the formed conductive structure followed by a CMP step to result in the structure 160 shown in FIG. 7C.

Still other embodiments depicted in FIGS. 8A and 8B, through top plan views, show how complex wire shapes 170, 180 respectively can be created by careful sizing of polysilicion structure shape and dielectric coverings according to the processes described herein to prevent undesired silicide formations according to the invention.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for forming at least two conductive silicide wires of sub-lithographic dimension comprising:

forming a topographic feature of silicon-containing material on a substrate;

forming a dielectric cap on the topographic feature;

applying a mask structure to the dielectric cap;

etching the dielectric cap and the topographic feature selective to the mask structure to form a pattern from the topographic feature and to expose a sidewall portion of said topographic feature, said pattern being a single lithographically defined feature;

depositing a metal at said on opposing sides of said sidewall portions of the pattern of said topographic feature that are exposed;

forming metal silicide on said opposing sides of said sidewall portions of the pattern of the topographic feature, wherein the metal silicide provides at least two separate metal silicide conductive structures formed on the single lithographically defined feature;

removing said dielectric cap layer; and removing said pattern of said topographic feature, wherein the at least two separate metal silicide conductor structures provide the at least two conductive silicide wires, wherein the at least two conductive silicide wires are parallel to one another.

2. The method as claimed in claim 1, wherein each of said at least two separate metal silicide conductor structures is of high aspect ratio.

3. The method as claimed in claim 1, wherein said high aspect ratio ranges from 1:1 to 20:1 (height to width dimension).

4. The method as claimed in claim 1, wherein said pattern of said silicon-containing topographic feature is formed on an insulator structure.

5. The method as claimed in claim 1, wherein said silicon-containing topographic feature is formed on a silicon-containing substrate.

6. The method as claimed in claim 1, wherein said silicon-containing material includes polysilicon, polySiGe, or doped polysilicon.

7. The method as claimed in claim 2, wherein the deposited metal includes one of Ti, Ta, Al, W, Co, Mo, Ni, Pt, Pd, or alloys thereof.

8. The method as claimed in claim 2, wherein said forming at least two metal silicide conductive structures on opposing sides of said sidewall portion of said topographic feature includes:

reacting said deposited metal with said polysilicon topographic feature under temperature and time conditions sufficient for forming said metal silicide; and stripping away any unreacted metal.

9. The method as claimed in claim 1, applicable for forming wire structures for FEOL and BEOL semiconductor processing applications.

10. The method as claimed in claim 1, wherein prior to forming said silicon-containing topographic feature, forming a metal diffusion barrier layer of material underneath said silicon-containing topographic feature.

11. The method as claimed in claim 9, further comprising:

implementing an electroplating technique for forming metal plates out of said at least two separate metal silicide conductor structures for thickening or reinforcing said one or more metal silicide conductors.

12. The method as claimed in claim 11, further comprising:

forming a dielectric material between said formed metal plates to result in a capacitor device.

13. A method of forming a conductor structure for use in FEOL and BEOL semiconductor processing applications comprising:

providing a first structure of material;

forming a topographic feature of silicon-containing material on top said first structure and, a dielectric cap layer on top said topographic feature;

applying a mask to expose a sidewall portion of said topographic feature corresponding to a conductive structure to be formed;

depositing a metal at said exposed sidewall portion;

forming a metal silicide structure that encircles said topographic feature, but is not present underlying said topographic feature;

removing said topographic feature and said dielectric cap layer to form a trench;

forming a metal diffusion barrier liner layer conforming to bottom and sidewall surface of said trench; and depositing a metal conductor material in said trench.

14. The method as claimed in claim 13, wherein said diffusion barrier liner layer for a bottom trench surface is formed beneath said silicon-containing topographic feature prior to forming said topographic feature, said formed metal silicide structure in electrical contact with said prior formed bottom trench diffusion barrier liner layer.

15. The method as claimed in claim 13, wherein said metal conductor material is selected from the group of Cu, Ti, Ta, W, Co, Ni, Pt, Pd or Al.

16. The method as claimed in claim 13, wherein said depositing metal for forming said silicide comprises: Ti, Ta, Al, W, Co, Mo, Ni, Pt, Pd or allow thereof.

17. The method as claimed in claim 13, used for forming complex metal silicide conductor structures.

* * * * *